US008761026B1

(12) United States Patent
Berry et al.

(10) Patent No.: US 8,761,026 B1
(45) Date of Patent: Jun. 24, 2014

(54) COMPACT MICROSTRIP HYBRID COUPLED INPUT MULTIPLEXER

(71) Applicant: Space Systems/Loral, LLC, Palo Alto, CA (US)

(72) Inventors: Stephen D. Berry, San Ramon, CA (US); George Fiedziuszko, San Jose, CA (US); Jonathan Chang, Palo Alto, CA (US)

(73) Assignee: Space Systems/Loral, LLC, Palo Alto, CA (US)

( * ) Notice: Subject to any disclaimer, the term of this patent is extended or adjusted under 35 U.S.C. 154(b) by 0 days.

(21) Appl. No.: 13/870,761

(22) Filed: Apr. 25, 2013

(51) Int. Cl.

| | |
|---|---|
| ***G01R 31/08*** | (2006.01) |
| ***G06F 11/00*** | (2006.01) |
| ***G08C 15/00*** | (2006.01) |
| ***H04J 1/16*** | (2006.01) |
| ***H04J 3/14*** | (2006.01) |
| ***H04L 1/00*** | (2006.01) |
| ***H04L 12/26*** | (2006.01) |

(52) U.S. Cl.
USPC ............ 370/241; 370/497; 327/403; 327/407

(58) Field of Classification Search
USPC .......................... 327/403–419; 370/532–541
See application file for complete search history.

(56) References Cited

U.S. PATENT DOCUMENTS

| | | | | |
|---|---|---|---|---|
| 5,233,609 | A * | 8/1993 | Hunton | 370/497 |
| 6,628,920 | B1 | 9/2003 | Wolcott et al. | |
| 6,704,285 | B1 * | 3/2004 | Grandchamp et al. | 370/241 |
| 7,084,369 | B2 * | 8/2006 | Sosnowski | 219/121.43 |
| 2011/0261734 | A1 * | 10/2011 | Dupuy et al. | 370/297 |
| 2012/0007605 | A1 * | 1/2012 | Benedikt | 324/612 |
| 2013/0083703 | A1 * | 4/2013 | Granger-Jones et al. | 370/277 |
| 2013/0100971 | A1 * | 4/2013 | Kunes et al. | 370/537 |
| 2013/0201880 | A1 * | 8/2013 | Bauder et al. | 370/277 |
| 2013/0201881 | A1 * | 8/2013 | Bauder et al. | 370/277 |
| 2013/0201882 | A1 * | 8/2013 | Bauder et al. | 370/277 |

OTHER PUBLICATIONS

Cameron et al., "Design of Manifold-Coupled Multiplexers", IEEE Microwave Magazine, Oct. 2007, 14 pages.
Kudsia et al., "Innovations in Microwave Filters and Multiplexing Networks for Communications Satellite Systems", IEEE Transactions on Microwave Theory and Techniques, vol. 40. No. 6, Jun. 1992, 17 pages.

(Continued)

*Primary Examiner* — Brandon S Cole
(74) *Attorney, Agent, or Firm* — Weaver Austin Villeneuve & Sampson LLP

(57) ABSTRACT

A multiplexer includes a filter channelizer having at least two output filters, each output filter being coupled with a respective hybrid coupler. The multiplexer channelizes an input radio frequency (RF) band of electromagnetic energy into a set of output ports. Each hybrid coupler includes an input port (port 1), two output ports and an isolated port (port 4). Each output filter is coupled to a first one of the two output ports of a respective hybrid coupler, a second one of the two output ports being connected to an open stub microstrip transmission line. The respective hybrid coupler is coupled in a daisy chain, by way of port 1 and port 4, with one or more of the input of the multiplexer, and at least one other hybrid coupler. Advantageously, each output channel may include no more than one filter and no more than one hybrid coupler.

20 Claims, 5 Drawing Sheets

(56) References Cited

OTHER PUBLICATIONS

Llorente-Romano et al., “Microstrip Filter and Power Divider with Improved Out-of-Band Rejection for a Ku-Band Input Multiplexer”, 33rd European Microwave Conference, Munich, vol. 1, Oct. 7, 2003, 5 pages.
Fiedziuszko, “Dual-Mode Dielectric Resonator Loaded Cavity Filters”, IEEE Transactions on Microwave Theory and Techniques, vol. MTT-30 No. 9, Sep. 1982, 6 pages.

* cited by examiner

COMPACT MICROSTRIP HYBRID COUPLED INPUT MULTIPLEXER

TECHNICAL FIELD

This invention relates generally to a multiplexer, and particularly to a compact microstrip hybrid coupled input multiplexer.

BACKGROUND OF THE INVENTION

The assignee of the present invention manufactures and deploys spacecraft for, inter alia, communications and broadcast services from geostationary orbit. Payload systems of such spacecraft conventionally employ input multiplexers to channelize a radio frequency band of electromagnetic energy into a set of channels by use of a filter bank. The mass, efficiency, cost, and complexity of a multiplexer are important factors in determining the overall performance of the payload system.

A known hybrid coupled multiplexer 100, supporting 'n' channels, is illustrated in FIG. 1. For each channel (i), the multiplexer includes a first 90° hybrid coupler 110(*i*) and a second 90° hybrid coupler 130(*i*). Disposed in parallel between the first hybrid coupler 110(*i*) and the second hybrid coupler 130(*i*) are two substantially identical filters, 121(*i*) and 122(*i*). Because each filter handles only 50% of the power per channel, the above-described approach mitigates certain power and voltage handling problems, particularly for high power applications.

Since each channel requires two filters and two hybrid couplers, however, the mass, cost and volume of the device is undesirably large.

As a result, an improved input multiplexer design is desirable.

SUMMARY OF INVENTION

The present inventors have appreciated that an input multiplexer having a filter channelizer that includes a number of channel filter arrangements may be configured such that, for each channel, no more than one filter and one hybrid coupler are required.

In an embodiment, a multiplexer includes an input and a plurality of outputs, and a filter channelizer that includes at least two output filters. Each output filter is coupled with a respective hybrid coupler. Each respective hybrid coupler includes an input port (port 1), two output ports (ports 2 and 3) and an isolated port (port 4). The multiplexer is configured to channelize an input radio frequency (RF) band of electromagnetic energy into a set of output channels by way of the filter bank. An input of each filter is coupled with a respective one of the plurality of multiplexer outputs. An input of each output filter is coupled to a first one of the two output ports of a respective hybrid coupler, a second one of the two output ports of the respective hybrid coupler being connected to a reflective open stub transmission line. The respective hybrid coupler is coupled in a daisy chain, by way of port 1 and port 4, with one or more of the input of the multiplexer, and at least one other respective hybrid coupler in the daisy chain.

In another embodiment, at least one output filter may be coupled directly to the respective one of the plurality of multiplexer outputs.

In yet a further embodiment, for each of the output channels, the multiplexer may include no more than one filter, and no more than one hybrid coupler.

In an embodiment, each reflective open stub transmission line may be configured such that the respective hybrid coupler has a balanced reflected signal at the two output ports. The multiplexer may be an input multiplexer of a spacecraft communications payload system. The RF signal may be at a frequency range between three KHz and three hundred GHz.

In another embodiment, the multiplexer may be a manifold coupled multiplexer, the manifold including microstrip transmission lines configured to receive an input radio frequency (RF) signal at an input port and to distribute the input RF signal to each of the respective hybrid couplers. The microstrip transmission lines may be planar conductive paths disposed on a dielectric substrate.

In a further embodiment, at least two output channels of the set of output channels may be contiguous in frequency.

In a still further embodiment, each of the set of output channels may be respectively contiguous in frequency.

In an embodiment, a spacecraft communications payload system includes at least one input multiplexer. The at least one input multiplexer may include an input and a plurality of outputs, and a filter bank including at least two output filters, each output filter being coupled with a respective hybrid coupler, each respective hybrid coupler including an input port (port 1), two output ports (ports 2 and 3) and an isolated port (port 4). The multiplexer may be configured to channelize an input radio frequency (RF) band of electromagnetic energy into a set of output channels by way of the filter bank. An input of each output filter may be coupled with a respective one of the plurality of multiplexer outputs. An input of each output filter is coupled to a first one of the two output ports of a respective hybrid coupler, a second one of the two output ports of the respective hybrid coupler being connected to a reflective open stub transmission line. The respective hybrid coupler is coupled in a daisy chain, by way of port 1 and port 4, with one or more of the input of the multiplexer, and at least one other respective hybrid coupler in the daisy chain.

BRIEF DESCRIPTION OF THE DRAWINGS

Features of the invention are more fully disclosed in the following detailed description of the preferred embodiments, reference being had to the accompanying drawings, in which.

Figure 1:
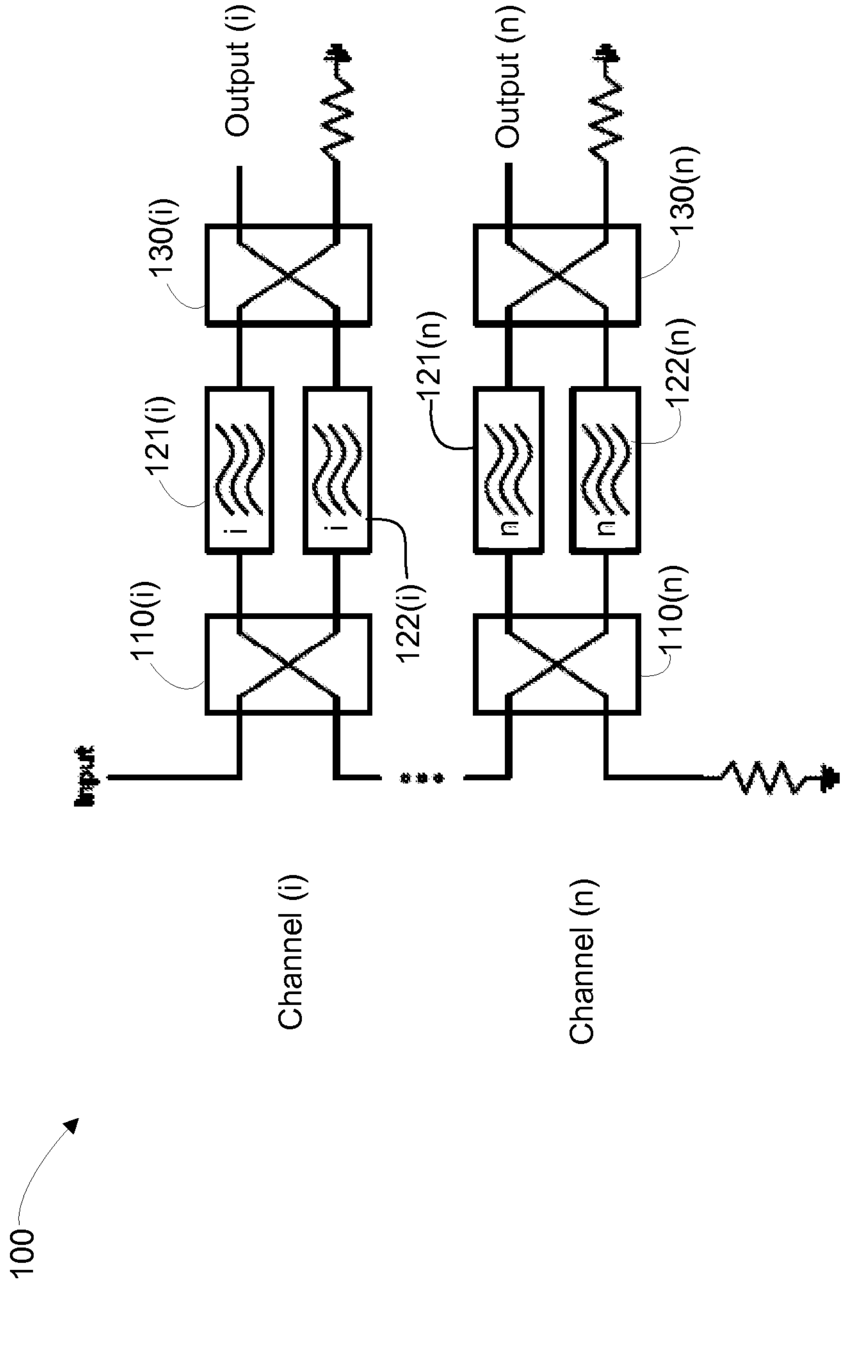
Figure 1 (PRIOR ART)
FIG. 1 illustrates a schematic diagram of an input multiplexer, according to the prior art.

Throughout the drawings, the same reference numerals and characters, unless otherwise stated, are used to denote like features, elements, components, or portions of the illustrated embodiments. Moreover, while the subject invention will now be described in detail with reference to the drawings, the description is done in connection with the illustrative embodiments. It is intended that changes and modifications can be made to the described embodiments without departing from the true scope and spirit of the subject invention as defined by the appended claims.

DETAILED DESCRIPTION

Specific exemplary embodiments of the invention will now be described with reference to the accompanying drawings.

This invention may, however, be embodied in many different forms, and should not be construed as limited to the embodiments set forth herein. Rather, these embodiments are provided so that this disclosure will be thorough and complete, and will fully convey the scope of the invention to those skilled in the art.

It will be understood that when an element is referred to as being "connected" or "coupled" to another element, it can be directly connected or coupled to the other element, or intervening elements may be present. Furthermore, "connected" or "coupled" as used herein may include wirelessly connected or coupled. It will be understood that although the terms "first" and "second" are used herein to describe various elements, these elements should not be limited by these terms. These terms are used only to distinguish one element from another element. Thus, for example, a first user terminal could be termed a second user terminal, and similarly, a second user terminal may be termed a first user terminal without departing from the teachings of the present invention. As used herein, the term "and/or" includes any and all combinations of one or more of the associated listed items. The symbol "/" is also used as a shorthand notation for "and/or".

The terms "spacecraft", "satellite" and "vehicle" may be used interchangeably herein, and generally refer to any orbiting satellite or spacecraft system.

The term "hybrid coupler", unless otherwise expressly qualified, means a 90 degree 3 dB hybrid coupler, variants of which may include a quadrature coupler, a branchline coupler, a coupled line coupler or a Lange coupler.

The present inventors have appreciated that an input multiplexer coupling an input radio frequency (RF) signal to a filter bank (or "channelizer") that includes a number of channel filter arrangements may be configured such that, for each channel, no more than one filter and one hybrid coupler are required. The multiplexer may be, for example, an input multiplexer of a spacecraft communications payload system. The RF signal may be at a frequency range between three KHz and three hundred GHz.

Figure 2:
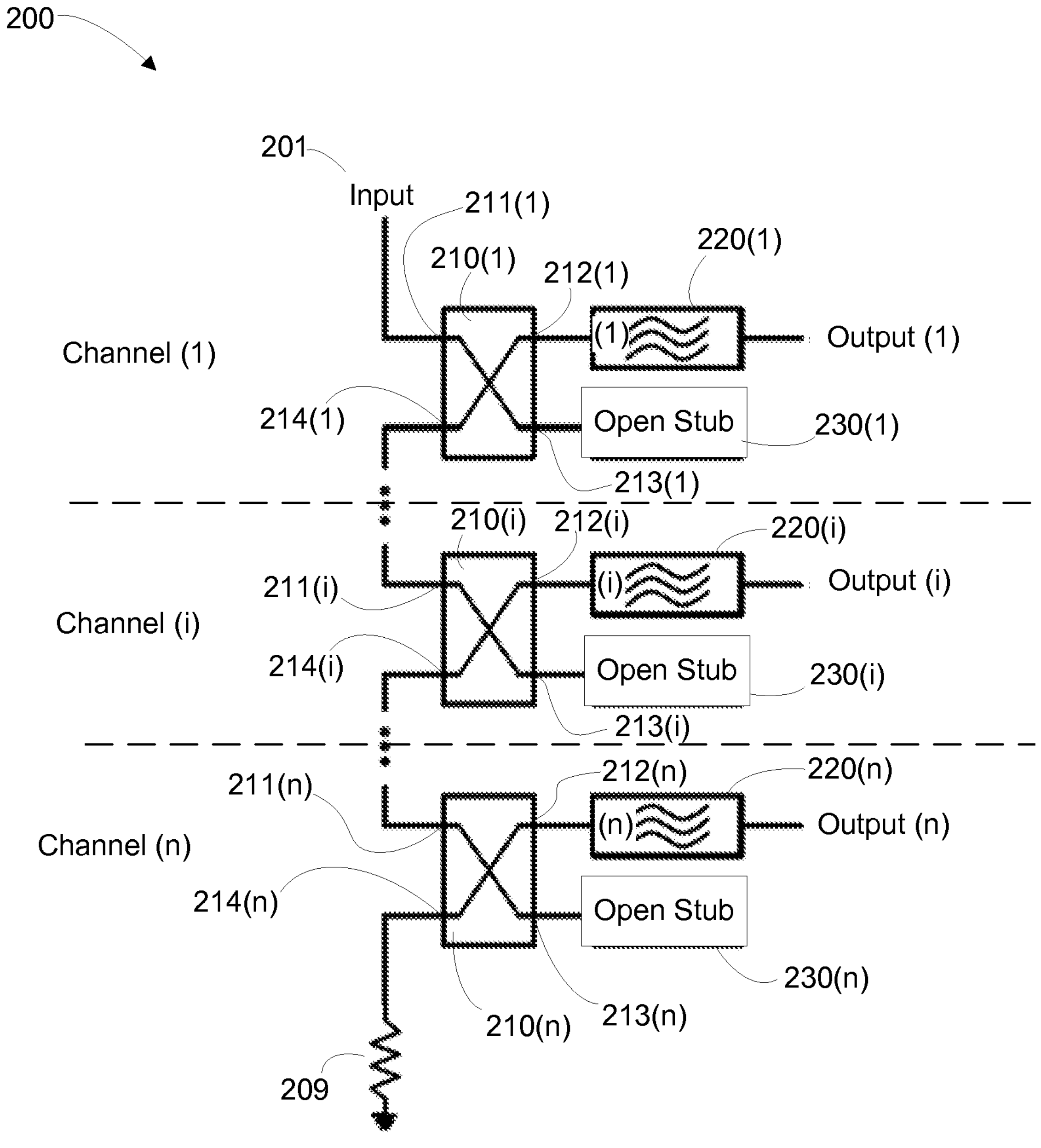
FIG. 2 illustrates a schematic diagram of an input multiplexer.

Referring now to FIG. 2, multiplexer 200 may include multiplexer input port 201 at which an RF signal may be received, load termination 209, and 'n' channels of filter arrangements. As a result of appropriate selection of filters 220(*i*), multiplexer 200 may be configured to channelize the input RF signal of electromagnetic energy into a respective set of output channels.

Each filter arrangement may include a hybrid coupler 210 (*i*). In an implementation, each hybrid coupler 210(*i*) may be a quadrature hybrid coupler. Other types of hybrid couplers are within the contemplation of the present inventors, however. For example, one or more hybrid couplers 210(*i*) may be a Lange coupler, a coupled line coupler, and/or multiple couplers in a series configuration to increase usable bandwidth of the multiplexer.

Port 211(*i*) may be referred to as the "hybrid input port", or "Port 1". Port 214(*i*) may be referred to as the "isolated port" or "Port 4". A first output port 212(*i*) (which may be referred to as "Port 2") of hybrid coupler 210(*i*) may be coupled with an output filter 220(*i*). A second output port 213(*i*) (which may be referred to as "Port 3") of hybrid coupler 210(*i*) may be coupled with a reflective open stub 230(*i*). Advantageously, there may be no more than one filter and one hybrid coupler associated with each channel output (i).

In the illustrated embodiment, each filter arrangement is configured in a daisy chain arrangement between multiplexer input 201 and load termination 209. More specifically, hybrid input port 211(1) may be coupled with mulitplexer input port 201, whereas isolated port 214(1) may be coupled with port 1 of an adjacent hybrid coupler. Similarly, isolated port 214(*n*) may be coupled with load termination 209, whereas hybrid input port 211(*n*) may be coupled with port 4 of an adjacent hybrid coupler (not illustrated).

In an embodiment, filter arrangements are respectively coupled by planar microstrip transmission lines. Moreover, the reflective open stub 230 connected with each respective hybrid coupler 210 may be an open stub microstrip transmission line that is configured to provide a matched reflected magnitude and phase to output ports 212 and 213. By appropriate selection and/or adjustment of the length of the open stub microstrip transmission line, the reflection coefficient associated with each output port may be matched. As a result, power reflected by each channel filter is transmitted with inconsequential loss down the daisy chain. More particularly, power reflected from filter 220(*i*) and open stub 230(*i*) may be combined at port 214(*i*) and transmitted to port 1 of an adjacent hybrid coupler (not illustrated). The hybrid couplers may be interconnected by line lengths having an arbitrary phase length.

Figure 3:
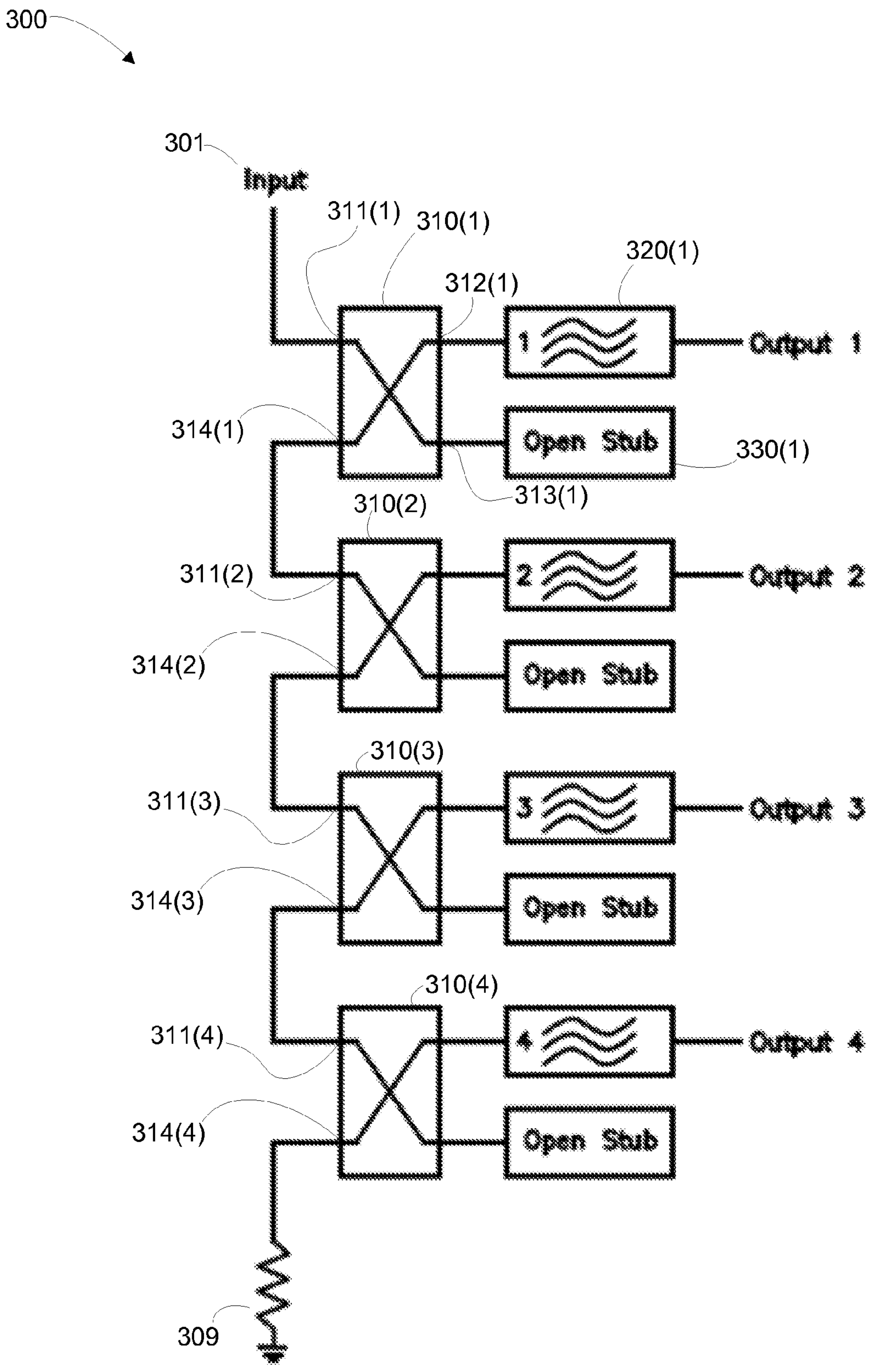
FIG. 3 illustrates a schematic diagram of a four channel multiplexer, according to an implementation.

In an example implementation, referring now to FIG. 3, multiplexer 300 may include multiplexer input port 301, load termination 309, and four channels of filter arrangements. Load termination 309 may be a 50 ohm load termination, for example. Each filter arrangement includes a hybrid coupler 310(*i*).

Port 311(*i*) may be referred to as the "hybrid input port", or "Port 1". Port 314(*i*) may be referred to as the "isolated port" or "Port 4". A first output port 312(*i*) (which may be referred to as "Port 2") of hybrid coupler 310(*i*) may be coupled with an output filter 320(*i*). A second output port 313(*i*) (which may be referred to as "Port 3") of hybrid coupler 310(*i*) may be coupled with a reflective open stub 330(*i*).

In the illustrated embodiment, each of four filter arrangements is configured in a daisy chain arrangement between multiplexer input 301 and load termination 309. More specifically, hybrid input port 311(1) is coupled with mulitplexer input port 301, whereas isolated port 314(1) is coupled with hybrid input port 311(2) of hybrid coupler 310(2). Similarly, isolated port 314(2) is coupled with hybrid input port 311(3) of hybrid coupler 310(3) and isolated port 314(3) is coupled with hybrid input port 311(4) of hybrid coupler 310(4). Finally isolated port 314(4) is coupled with 50 ohm load termination 309.

In an embodiment, one or more of the filters may be a bandpass filter. For example, one or more of the filters may be a high Q waveguide dual mode dielectric resonator filter providing low passband insertion loss variation, sharp out of band rejection, and flat passband group delay.

Referring now to FIG. 4A, an implementation is illustrated wherein a daisy chain arrangement between multiplexer input 401 and load termination 409 is provided by a microstrip manifold 400. Microstrip manifold 400 may include microstrip transmission lines 450(*i*) configured, for example, as planar conductive paths disposed on a first surface of a dielectric substrate, the dielectric substrate being grounded on a second, opposite surface. In one implementation, transmission lines 450(*i*) may be a highly conductive metal, such as gold or copper deposited on a substrate such as alumina.

In the illustrated implementation, each transmission line 450(*i*) may couple hybrid coupler 430(*i*) with hybrid coupler 430(*i*+1). More particularly, port 2 of hybrid coupler 410(1) is illustrated to be coupled by way of transmission line 450(1) with port 1 of hybrid coupler 410(2). Similarly, port 2 of hybrid coupler 410(2) is illustrated to be coupled by way of transmission line 450(2) with port 1 of hybrid coupler 410(3), and port 2 of hybrid coupler 410(3) is illustrated to be coupled by way of transmission line 450(3) with port 1 of hybrid coupler 410(4).

In the illustrated implementation, hybrid couplers 410(*i*) and reflective open stubs 430(*i*) may also be configured as planar conductive paths disposed on the dielectric substrate. Respective filters (not illustrated) may be coupled to microstrip manifold 400 by way of manifold output ports, each manifold output port conductively coupled to port 2 of a respective hybrid coupler. For example, a first filter (not shown) may be coupled to output port 402, that is conductively coupled to port 2 of hybrid coupler 410(1). Similarly, a second filter (not shown) may be coupled to output port 403, that is conductively coupled to port 2 of hybrid coupler 410 (2); a third filter (not shown) may be coupled to output port 404, that is conductively coupled to port 2 of hybrid coupler 410(3), and a fourth filter (not shown) may be coupled to output port 405, that is conductively coupled to port 2 of hybrid coupler 410(4).

Figure 4:
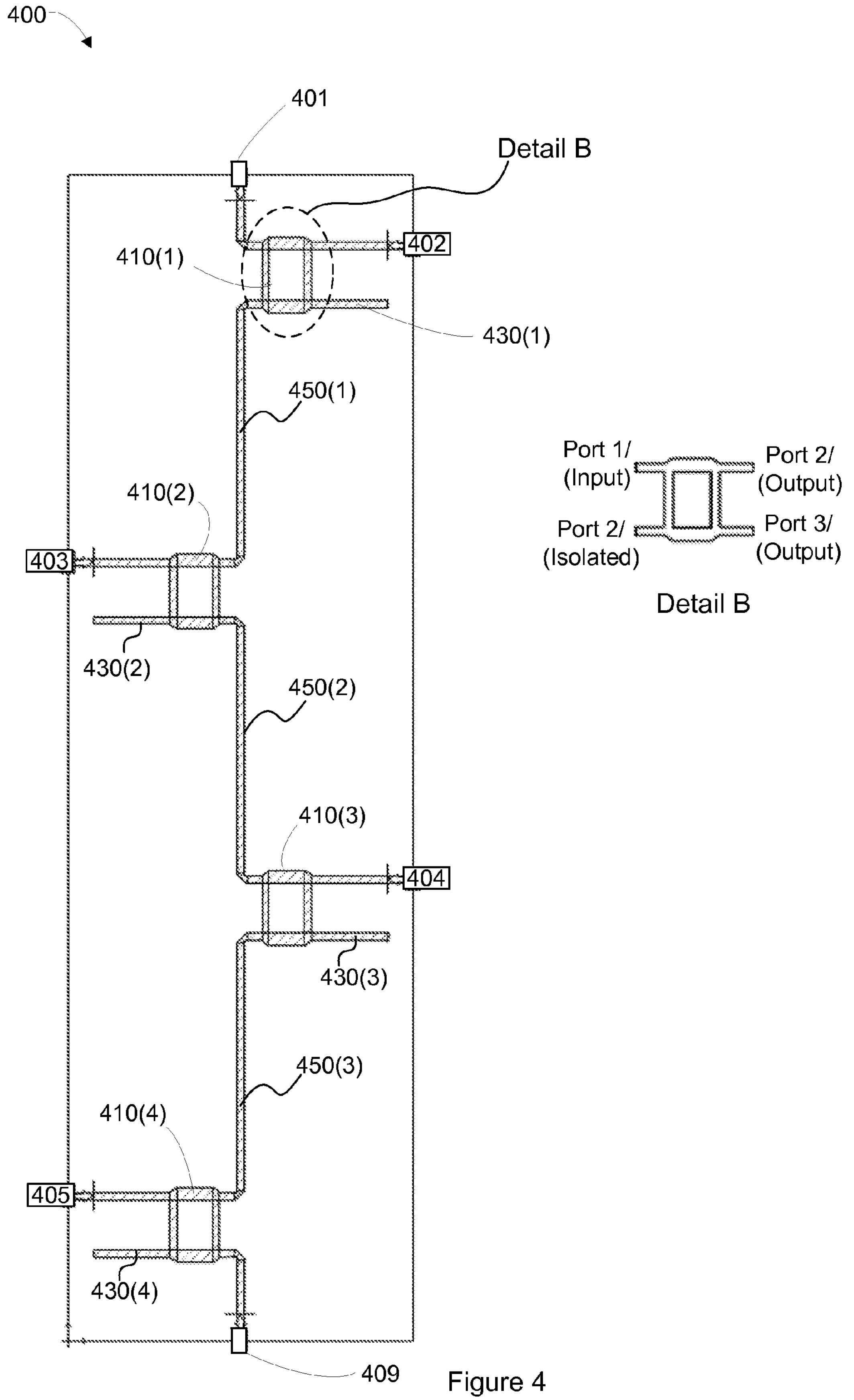
FIG. 4 illustrates a four channel multiplexer, according to an embodiment.

Compared to a conventional circulator coupled multiplexer, a four channel compact microstrip hybrid coupled input multiplexer of the type illustrated in FIG. 4 has been found to provide about a 25% reduction in mass, 50% reduction in footprint, and 50% reduction in cost. Electrical performance of the multiplexer has been verified by simulation and test as illustrated in FIGS. 5A and 5B which show, respectively, rejection and passband variation as a function of frequency.

Figure 5A:
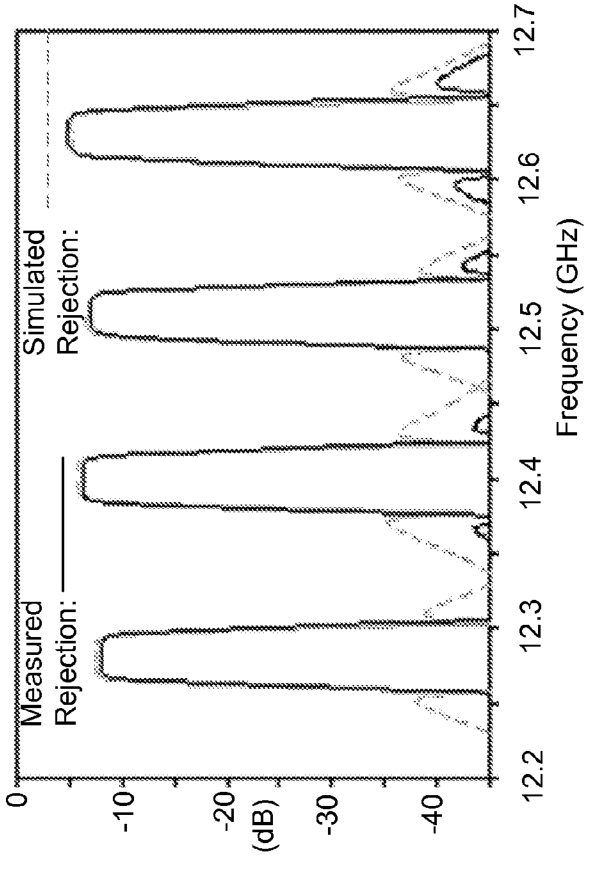
FIG. 5A and FIG. 5B illustrate performance of a four channel multiplexer, according to an embodiment.
Figure 5B:
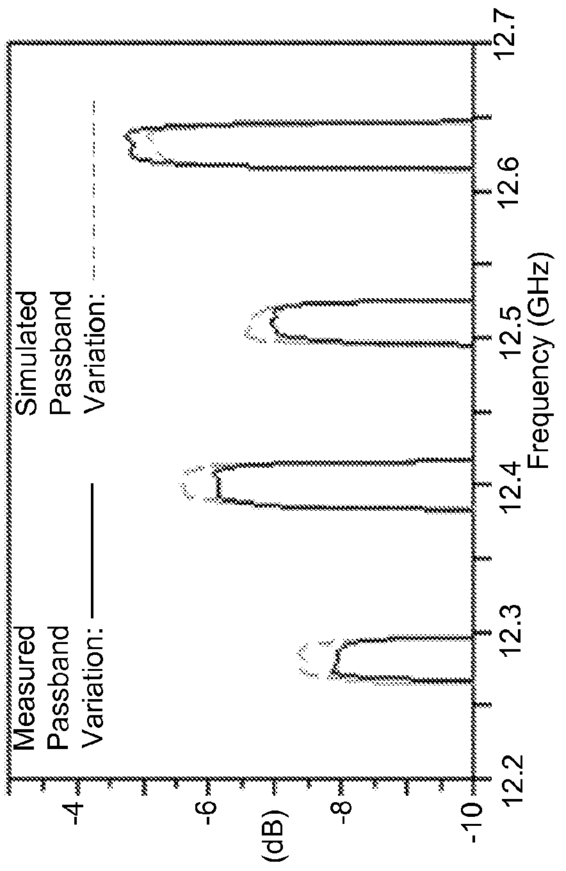

The performance data illustrated in FIGS. 5A and 5B relate to an implementation where adjacent channels are not contiguous. Thus, it may be observed, for example, that an approximately 100 MHz gap is provided between each 26 MHz channel. Such non-contiguous arrangements are conventional for satellite input multiplexers of the prior art. The present inventors have appreciated, however, the presently disclosed techniques permit a single multiplexer to provide two or more contiguous output channels. Indeed, if desired, all the output channels may be respectively contiguous in frequency.

Thus, a compact microstrip hybrid coupled input multiplexer has been disclosed.

The foregoing merely illustrates principles of the invention. It will thus be appreciated that those skilled in the art will be able to devise numerous systems and methods which, although not explicitly shown or described herein, embody said principles of the invention and are thus within the spirit and scope of the invention as defined by the following claims.

What is claimed is:

1. A multiplexer comprising:

an input and a plurality of outputs, and a filter channelizer comprising at least two output filters, each output filter being coupled with a respective hybrid coupler, each respective hybrid coupler comprising an input port (port 1), two output ports (ports 2 and 3) and an isolated port (port 4); wherein:

the multiplexer is configured to channelize an input radio frequency (RF) band of electromagnetic energy into a set of output channels by way of the filter bank;

each output filter is coupled with a respective one of the plurality of multiplexer outputs;

an input of each output filter is coupled to a first one of the two output ports of the respective hybrid coupler, a second one of the two output ports of the respective hybrid coupler being connected to a reflective open stub transmission line; and the respective hybrid coupler is coupled in a daisy chain, by way of port 1 and port 4, with one or more of the input of the multiplexer, and at least one other respective hybrid coupler in the daisy chain.

2. The multiplexer of claim 1, wherein at least one output filter is coupled directly to the respective one of the plurality of multiplexer outputs.

3. The multiplexer of claim 1, wherein for each of the output channels, the multiplexer includes no more than one filter, and no more than one hybrid coupler.

4. The multiplexer of claim 1, wherein each reflective open stub transmission line is configured such that the respective hybrid coupler has a balanced reflected signal at the two output ports.

5. The multiplexer of claim 1, wherein the multiplexer is an input multiplexer of a spacecraft communications payload system.

6. The multiplexer of claim 1, wherein the RF signal is at a frequency range between three KHz and three hundred GHz.

7. The multiplexer of claim 1, wherein the multiplexer is a manifold coupled multiplexer, the manifold including microstrip transmission lines configured to receive an input radio frequency (RF) signal at an input port and to distribute the input RF signal to each of the respective hybrid couplers.

8. The multiplexer of claim 7, wherein the microstrip transmission lines are planar conductive paths disposed on a dielectric substrate.

9. The multiplexer of claim 1, wherein at least two output channels of the set of output channels are contiguous in frequency.

10. The multiplexer of claim 1, wherein each of the set of output channels are respectively contiguous in frequency.

11. A spacecraft communications payload system comprising at least one input multiplexer, the at least one input multiplexer comprising:

an input and a plurality of outputs, and a filter bank comprising at least two output filters, each output filter being coupled with a respective hybrid coupler, each respective hybrid coupler comprising an input port (port 1), two output ports (ports 2 and 3) and an isolated port (port 4); wherein:

the multiplexer is configured to channelize an input radio frequency (RF) band of electromagnetic energy into a set of output channels by way of the filter bank;

each output filter is coupled with a respective one of the plurality of multiplexer outputs;

an input of each output filter is coupled to a first one of the two output ports of the respective hybrid coupler, a second one of the two output ports of the respective hybrid coupler being connected to a reflective open stub transmission line; and the respective hybrid coupler is coupled in a daisy chain, by way of port 1 and port 4, with one or more of the input of the multiplexer, and at least one other respective hybrid coupler in the daisy chain.

12. The payload system of claim 11, wherein at least one output filter is coupled directly to the respective one of the plurality of multiplexer outputs.

13. The payload system of claim 11, wherein for each of the output channels, the multiplexer includes no more than one filter, and no more than one hybrid coupler.

14. The payload system of claim 11, wherein each reflective open stub transmission lines is configured such that the respective hybrid coupler has a balanced reflected signal at the two output ports.

15. The payload system of claim 11, wherein the multiplexer is an input multiplexer of a spacecraft communications payload system.

16. The payload system of claim 11, wherein the RF signal is at a frequency range between three KHz and three hundred GHz.

17. The payload system of claim 11, wherein the multiplexer is a manifold coupled multiplexer, the manifold including microstrip transmission lines configured to receive an input radio frequency (RF) signal at an input port and to distribute the input RF signal to each of the respective hybrid couplers.

18. The payload system of claim 17, wherein the microstrip transmission lines are planar conductive paths disposed on a dielectric substrate.

19. The multiplexer of claim 11, wherein at least two output channels of the set of output channels are contiguous in frequency.

20. The multiplexer of claim 11, wherein each of the set of output channels are respectively contiguous in frequency.

* * * * *